Sept. 8, 1970 R. C. CHARBONNIER 3,528,027

ELECTRIC SIGNAL GENERATOR WITH ACCURATELY CONTROLLABLE PHASE-SETTINGS

Filed Feb. 19, 1968 2 Sheets-Sheet 1

United States Patent Office 3,528,027
Patented Sept. 8, 1970

3,528,027

ELECTRIC SIGNAL GENERATOR WITH ACCURATELY CONTROLLABLE PHASE-SETTINGS

Roger Charles Charbonnier, Meudon-Bellevue, France, assignor to Adret Electronique S.A., Trappes, France Filed Feb. 19, 1968, Ser. No. 707,390
Int. Cl. H03b *27/00*
U.S. Cl. 331—30 8 Claims

ABSTRACT OF THE DISCLOSURE

For the generation of sine wave voltages with accurately controllable and programmable phase-settings, a generator is provided which comprises a decade pulse counter operating as a frequency divider and a coincidence logic device being adapted for generating a pulse each time the count of said pulse counter coincides with a predetermined assigned digital value set on said coincidence logic device.

This invention relates to generators of electric signals and, more particularly, but not exclusively, of sine wave voltages in the low and very low frequency ranges, whose phase-settings are accurately determined and may vary in accordance with a predetermined program.

In prior art, motor-driven sine wave potentiometric generators have been used: by arranging, in a line, two or more potentiometers whose stators or rotors can be set off by a known variable angle, it is obvious that the desired phase-setting are obtained.

However, this known process is mechanical and lends itself with difficulty to phase-setting programming, i.e., automatic control of their adjustment from digital data originally from a program generator. Now, this type of control corresponds to the need of modern control and adjustment techniques of automatic manufacturing processes. The instant invention overcomes this difficulty.

It is an object of the present invention to provide a device for producing first and second electrical recurrent sine wave signals having a variable frequency $\Delta F/10^n$, $n$ being an integer and accurately controllable phase-settings one with respect to the other, said device comprising a frequency divider of the pulse counter type which has a division ratio $k$, said frequency divider having an input and an output, generator means for producing recurrent pulses at a frequency $k(F^1+\Delta F/10^n)$, said generator means being connected to the input of said frequency divider; gating means connected to said frequency divider for generating a pulse each time the count of said frequency divider coincides with a predetermined assigned digital value comprised between 0 and $k$, said gating means having an output; a first modulator having first and second input, the first input of said first modulator being connected to the output of said frequency divider; oscillator means, connected to the second input of said first modulator, for generating a sine wave signal of frequency $F^1$; a second modulator having first and second inputs, the first input of said second modulator being connected to the output of said gating means and the second input of said second modulator being connected to the said oscillator means, said first and second modulators each having an output and first and second filter means, connected to the respective outputs of said first and second modulators, for delivering the subtractive beat frequencies obtained from said first and second modulators, respectively.

By varying integer $n$, it is possible to obtain two (or more) purely sinusoidal frequencies with a phase-shift that may be programmed by means of numerical data, said frequencies being adapted to vary in a plurality of low and very low frequency ranges, which is particularly valuable for numerous applications.

It is another object of this invention to provide a device of the type described hereinabove, wherein said generator means produces a fixed frequency $kF^1$, whereas said oscillator means produce a variable frequency $F^1+\Delta F/10^n$.

These and other objects of the present invention will become apparent from the following description.

Figures 1, 2:
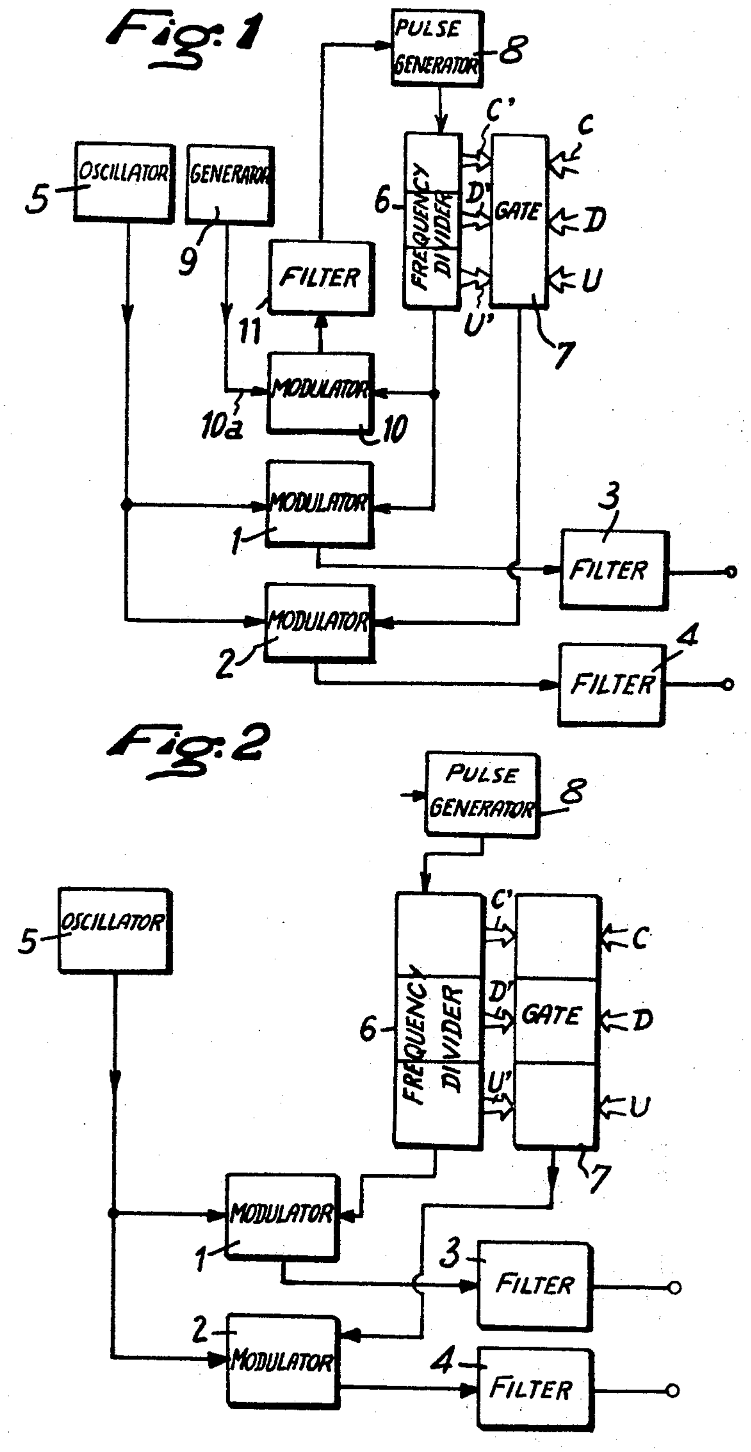
FIG. 1 is a block diagram of a generator adapted for producing two sine wave voltages having, one with respect to the other, a phase-shift which is adapted to be controlled in accordance with a predetermined program.
FIG. 2 illustrates a modified embodiment of such a generator.

The generator shown in FIG. 1 essentially consists of two modulators 1 and 2 whose outputs are respectively connected to two filters 3 and 4 which receive, on the one hand, a purely sinusoidal voltage of fixed frequency $F^1$ provided by an oscillator 5, and on the other hand, two periodic voltages in the form of recurrent impulses having the same variable frequency $F^1+\Delta F/10^n$. The voltage of frequency $F^1+\Delta F/10^n$ provided to modulator 1 originates from a frequency divider 6, while the frequency voltage $F^1+\Delta F/10^n$ provided to modulator 2 originates from a coincidence logic device or gating means 7. This latter device receives, on the one hand, an assigned digital value on its inputs C, D, U (corresponding respectively to the hundredths, tenths and unit figures of said value), and on the other hand, on its inputs C', D', U', the corresponding significant figures of the count from frequency divider 6.

The divider 6 is a pulse counter driven by an impulse generator 8 having a variable recurrent frequency $k(F^1+\Delta F/10^n)$, $k$ being the dividing ratio of divier 6. The coincidence logic device 7 is a comparator which may be for instance of the type disclosed in Electronics, No. 9, vol. 39, May 2, 1966, pages 60–69, by Leon F. Blachowicz.

This frequency is regulated so that $k(F^1+\Delta F/10^n)$ is exactly equal to $k$ times the frequency $(F^1+\Delta F/10^n)$ provided by a generator 9, the regulation being effected by means of a control feed-back loop comprising a modulator 10 which receives, on the one hand, the output frequency of generator 9, and on the other hand, the output frequency of the divider, and whose output voltage controls generator 8 after smoothing through a filter 11. The generator 9 will, for instance, provide a frequency varying from 5000.001 to 5999.9 Hz.

Modulators 1 and 2 are of a type capable of delivering a purely sinusoidal subtractive beat frequency from frequencies $F^1$ and $F^1+\Delta F/10^n$ of which $F^1$ alone is sinusoidal. Any embodiment of such a generator will be disclosed hereinafter with reference to FIG. 3. It results that a purely sinusoidal voltage of frequency $\Delta F/10^n$ is collected at the output of each of the filters 3 and 4. As an illustrative example, $F^1=5000$ Hz., so that $\Delta F/10^n$ varies from 0.001 to 999.9 Hz. Examining now, the relative phase-shift of these two output voltages at frequency $\Delta F/10^n$ i.e. that of impulses originating respectively from divider 6 and device 7 (provided filters 3 and 4 have identical delay characteristics), it is seen that the value of said phase-shift is expressed by a number which corresponds to the digital information applied in CDU, in degrees if $k=360$ and in grades if $k=400$.

Indeed, divider 6 displays a count of 0 after delivering a signal to its output, and its count progresses from 0 to 360 until delivery of the next signal while device 7 delivers a signal to its output each time there is a coincidence between C′ D′ U′ count of the divider and the displayed CDU value. This accounts for a delay of this last signal with respect to the output signal of the meter, which is equal to a CDU/360 of a period of frequency F.

It is clear that the device of FIG. 1 makes it possible to obtain a phase-shift that may be programmed between two voltages whose frequency may vary in wide LF and VLF ranges.

It is to be observed that sine wave generator 5 and impulse generator 8 have, so to speak, a symmetrical role, so that it is possible to use a fixed frequency impulse generator and a variable frequency sine wave generator.

Such an embodiment is shown in FIG. 2, in which like reference numerals designate like parts as in FIG. 1. Sine wave generator 5 has a variable frequency $F^1+\Delta F/10^n$, while impulse generator 8 has a fixed frequency $kF^1$. This latter generator, therefore, does not require any frequency regulating device and this is why units 9, 10, 11 of FIG. 1 have been omitted from FIG. 2.

The operation of the device of FIG. 1 is, except for this difference, the same as for the one in FIG. 2. It is self-evident that various embodiments of the circuits that have been described and shown, and various modifications of the diagram may be conceived by those skilled in the art, without departing from the scope of the invention.

Figure 3:
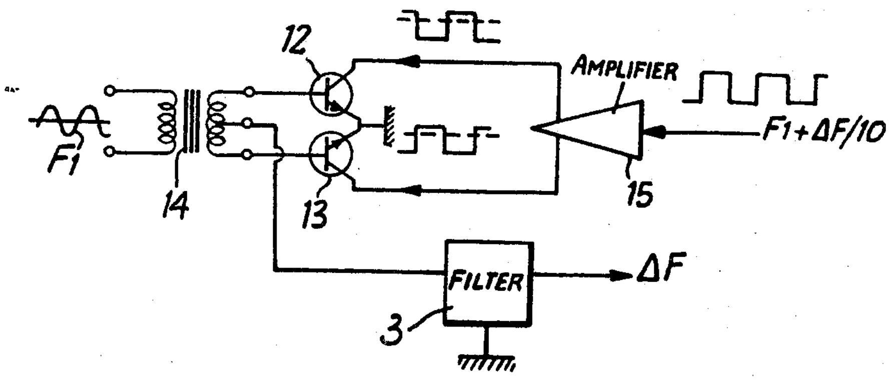
FIG. 3 illustrates a modulator which is adapted for use in a generator in accordance with the present invention.

As an example, FIG. 3 illustrates a practical embodiment of modulator 1 (or 2) of FIG. 1 (or 2). Such a modulator, also known as a "phase detector," receives the sine wave frequency $F^1$ through a transformer 14 and the square wave of pulse frequency $F^2=F^1+\Delta F/10^n$ through an amplifier 15. The mid-point of the secondary winding of transformer 14 is connected to the input of filter 3 which will deliver a sine wave frequency $F^2-F^1=\Delta F/10^n$. The terminals of the said secondary winding are respectively connected to the bases of transistors 12 and 13, the emitters of which are grounded. Amplifier 15 has two symmetrical outputs which are respectively connected to the collectors of transistors 12 and 13.

It may be shown that the modulator above described will provide a pure beat frequency $F^2-F^1$ free of any harmonic, and further frequencies $F^2$, $F^1$, $3F^2$, etc., which will be cut out by filter 3.

What is claimed is:

1. A device for producing first and second electrical recurrent sine wave signals having a variable frequency $\Delta F/10^n$, $n$ being an integer and accurately controllable phase-settings one with respect to the other, said device comprising a frequency divider of the pulse counter type which has a division ratio $k$, said frequency divider having an input and an output, generator means for producing recurrent pulses at a frequency $k(F^1+\Delta F/10^n)$, said generator means being connected to the input of said frequency divider; gating means connected to said frequency divider for generating a pulse each time the count of said frequency divider coincides with a predetermined assigned digital value comprised between 0 and $k$, said gating means having an output; a first modulator having first and second inputs, the first input of said first modulator being connected to the output of said frequency divider; oscillator means, connected to the second input of said first modulator, for generating a sine wave signal of frequency $F^1$; a second modulator having first and second inputs, the first input of said second modulator being connected to the output of said gating means and the second input of said second modulator being connected to the said oscillator means; said first and second modulators each having an output for delivering the subtractive beat frequencies obtained from said first and second modulators, respectively.

2. A device for producing first and second electrical recurrent sine wave signals having a variable frequency $\Delta F/10^n$, $n$ being an integer and accurately controllable phase-settings one with respect to the other, said device comprising a frequency divider of the pulse counter type which has a division ratio $k$, said frequency divider having an input and an output, generator means for producing recurrent pulses at a frequency $kF^1$, said generator means being connected to the input of said frequency divider; gating means connected to said frequency divider for generating a pulse each time the count of said frequency divider coincides with a predetermined assigned digital value comprised between 0 and $k$, said gating means having an output; a first modulator having first and second inputs, the first input of said first modulator being connected to the output of said frequency divider; oscillator means, connected to the second input of said first modulator, for generating a sine wave signal of frequency $F^1\Delta F/10^n$; a second modulator having first and second inputs, the first input of said second modulator being connected to the output of said gating means and the second input of said second modulator being connected to the said oscillator means; said first and second modulators each having an output for delivering the subtractive beat frequencies obtained from said first and second modulators, respectively.

3. A device as claimed in claim 1, wherein said generator means have a control input, said device further comprising further means for generating a recurrent signal of frequency $F^1+\Delta F/10^n$, a third modulator having first and second inputs and an output, the first input of said third modulator being connected to said further means, whereas the second input of said third modulator is connected to the output of said frequency divider and filter means for delivering the subtractive beat frequency obtained from said third modulator, said filter means connecting the output of said third modulator to the control input of said generator means.

4. The invention defined in claim 1 including first and second filter means connected to the respective outputs of said first and second modulators to deliver sine wave subtractive beat frequencies.

5. The invention defined in claim 2 including first and second filter means connected to the respective outputs of said first and second modulators to deliver sine wave subtractive beat frequencies.

6. A device for producing first and second electrical recurrent output signals having a common variable frequency and accurately controlled phase-settings one with respect to the other, said device comprising a frequency divider having an input and an output and a selected division ratio, generator means for producing first signals having a first frequency, being connected to the input of said frequency divider; gating means connected to said frequency divider for generating a second signal having a second frequency each time the count of said frequency divider coincides with a predetermined assigned digital value, said gating means having an output; a first modulator having first and second inputs, the first input of said first modulator being connected to the output of said frequency divider; oscillator means connected to the second input of said first modulator for generating a third signal having a third frequency; a second modulator having first and second inputs, the first input of said second modulator being connected to the output of said gating means and the second input of said second modulator being connected to the said oscillator means; said first and second modulators each having an output for delivering the subtractive beat frequencies obtained from said first and second modulators, respectively, said first modulator being effective to deliver to its associated output a first beat frequency representative of the difference between said third frequency and the selected output frequency of said frequency divider, and said second modulator being effective to deliver to its associated output a second beat frequency representative of the difference between said third frequency and said second frequency, said first and second subtractive beat frequencies having a common nominal frequency and a controllable phase shift therebetween.

7. A device as claimed in claim 6, wherein said generator means has a control input, said device further comprising further means for generating a recurrent signal having said first frequency, a third modulator having first and second inputs and an output, the first input of said third modulator being connected to receive said fourth recurrent signal, the second input of said third modulator being connected to the output of said frequency divider, and means for delivering the beat frequency between said fourth recurrent signal and said first signal obtained from said third modulator, to the control input of said generator means to regulate the frequency of said first signals.

8. The invention defined in claim 6 including individual filter means respectively connected to the outputs of said first and second modulators for producing sine waves from said first and second beat frequencies.

References Cited

UNITED STATES PATENTS 2,777,064 1/1957 Robinson ---------- 331—22

JOHN KOMINSKI, Primary Examiner

U.S. Cl. X.R.

331—38, 45

UNITED STATES PATENT OFFICE
CERTIFICATE OF CORRECTION

Patent No. 3,528,027 -- September 8, 1970

Roger Charles Charbonnier

It is certified that error appears in the above identified patent and that said Letters Patent are hereby corrected as shown below:

In the heading to the printed specification, after line 7, insert -- Claims priority, application France, Feb. 20, 1967, P.V. 95,558 --.

Signed and sealed this 16th day of March 1971.

(SEAL)
Attest:

Edward M. Fletcher, Jr.
Attesting Officer

WILLIAM E. SCHUYLER, JR.
Commissioner of Patents